United States Patent
Deng

(10) Patent No.: US 9,385,141 B2
(45) Date of Patent: Jul. 5, 2016

(54) ARRAY SUBSTRATE, DISPLAY PANEL AND METHOD FOR MANUFACTURING ARRAY SUBSTRATE

(71) Applicant: BEIJING BOE OPTOELECTRONICS TECHNOLOGY CO., LTD., Beijing (CN)

(72) Inventor: Jian Deng, Beijing (CN)

(73) Assignee: BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 22 days.

(21) Appl. No.: 14/020,993

(22) Filed: Sep. 9, 2013

(65) Prior Publication Data

US 2014/0077214 A1    Mar. 20, 2014

(30) Foreign Application Priority Data

Sep. 19, 2012  (CN) .......................... 2012 1 0349520

(51) Int. Cl.
   *H01L 27/12*  (2006.01)
   *G02F 1/1368*  (2006.01)
   *G02F 1/1362*  (2006.01)

(52) U.S. Cl.
   CPC ............ *H01L 27/124* (2013.01); *G02F 1/1368* (2013.01); *H01L 27/1259* (2013.01); *H01L 27/1288* (2013.01); *G02F 2001/136231* (2013.01); *G02F 2001/136236* (2013.01); *G02F 2202/16* (2013.01)

(58) Field of Classification Search
   CPC .............. H01L 27/1255; H01L 27/124; H01L 27/1259; G02F 1/136213
   USPC ......... 349/47; 257/E27.111, E27.113, 59, 34; 438/34
   See application file for complete search history.

(56) References Cited

U.S. PATENT DOCUMENTS

| 2008/0224141 | A1* | 9/2008 | Nam ................. H01L 29/66765 257/59 |
| 2010/0289977 | A1* | 11/2010 | Liu ........................ H01L 27/12 349/44 |
| 2012/0081642 | A1 | 4/2012 | Park |

FOREIGN PATENT DOCUMENTS

| CN | 102544029 A | 7/2012 |
| KR | 1020110098554 A | 4/2012 |

OTHER PUBLICATIONS

Extended European Search Report issued on Dec. 17, 2013 by the European Patent Office for Application No. 13183464.0, 8 pages.
English abstract of KR 1020110098554 A (listed above), 1 page.
English abstract of CN 201210025865 A (listed above), 2 pages.

(Continued)

*Primary Examiner* — David Vu
*Assistant Examiner* — Mouloucoulaye Inoussa
(74) *Attorney, Agent, or Firm* — Ladas & Parry LLP

(57) ABSTRACT

An array substrate comprises a plurality of pixel units, and each pixel unit comprises a thin film transistor (TFT), a transparent conductive metal layer and a pixel electrode; the TFT includes a gate electrode, an active layer, a source electrode and a drain electrode; the active layer is disposed above or below the gate electrode; the transparent conductive metal layer makes contact with the active layer; and a channel of the active layer is defined by the source electrode and the drain electrode. A display panel and a method for manufacturing the array substrate are also disclosed.

14 Claims, 3 Drawing Sheets

(56) References Cited

OTHER PUBLICATIONS

Office action (in Chinese) issued Sep. 3, 2014 by the State Intellectual Property Office ("SIPO") for patent application No. CN201210340520.4, 6 pages.

English translation of Office action issued by SIPO for patent application No. CN201210340520.4 (listed above), 4 pages.

Office action (in Korean) issued on Sep. 3, 2014 by the Korean Intellectual Property Office (KIPO) for patent application No. 10-201300112129, 6 pages.

English (machine translation) of the Office action (Examination Opinion) issued by KIPO in reference to patent application No. 10-201300112129 (listed above), 2 pages.

Office action (in Korean) issued on Mar. 12, 2015 by the Korean Intellectual Property Office (KIPO) for patent application No. 10-2013-0112129, 3 pages.

English translation of the Office action (Examination Opinion) issued by KIPO in reference to patent application No. 10-2013-0112129 (listed immediately above), 2 pages.

Office action (in Korean) issued on Apr. 27, 2015 by the Korean Intellectual Property Office (KIPO) for patent application No. 10-2015-0051582, 3 pages.

English translation of the Office action (Examination Opinion) issued by KIPO in reference to patent application No. 10-2015-0051582 (listed immediately above), 1 page.

* cited by examiner

ARRAY SUBSTRATE, DISPLAY PANEL AND METHOD FOR MANUFACTURING ARRAY SUBSTRATE

CROSS REFERENCE TO RELATED APPLICATIONS

This application claims priority from Chinese National Application No. 201210349520.4 filed on Sep. 19, 2012, the contents of which are incorporated herein by reference.

TECHNICAL FIELD

The disclosure relates to an array substrate, a display panel and a method for manufacturing the array substrate.

BACKGROUND

Thin him transistor-liquid crystal displays (TFT-LCDs) have the characteristics of small size, low power consumption, relatively low manufacturing cost, non-radiation and the like, thereby prevailing in the current flat panel display (FPD) market.

Currently, the display mode of the TFT-LCDs mainly includes twisted nematic (TN) mode, vertical alignment (VA) mode, in-plane-switching (IPS) mode and advanced super dimension switch (AD-SDS, also referred to as ADS) mode.

The operating principles of an ADS mode liquid crystal display (LCD) are mainly as follows: a multidimensional electric field is formed with an electric field generated between edges of slit electrodes in the same plane and an electric field generated between a slit electrode layer and a plate electrode layer, so that liquid crystal molecules at all orientation between the slit electrodes in a liquid crystal cell and above the electrodes can rotate, and thus the operating efficiency of liquid crystals can be improved and the light transmission efficiency can be improved as well. By adoption of the ADS technology, the picture quality of TFT-LCD products can be improved. Moreover, the TFT-LCD products have the advantages of high resolution, high transmittance, low power consumption, wide viewing angle, high aperture ratio, low color difference, no push Mura and the like.

A conventional ADS mode TFT-LCD array substrate generally comprises a group of gate lines and a group of data lines which are vertically intersected with the gate lines; a pixel region (pixel unit) is defined by a gate line and a data line which are intersected with each other. As illustrated in FIG. 1 which is a cross-sectional view of the pixel region at a thin film transistor (TFT), each pixel region comprises a gate electrode 11 formed on a substrate 10, a gate insulating layer 12, an active layer 13, a source electrode 15, a drain electrode 16, a pixel electrode 14 (plate electrode), a passivation layer 17, and a common electrode 18 (slit electrode); the common electrode 18 is provided with a plurality of slit structures 181 and a plurality of electrode strips 182; and the TFT is constituted with the gate electrode 11, the gate insulating layer 12, the active layer 13, the source electrode 15 and the drain electrode 16.

In the process of manufacturing the array substrate, one mask patterning process is required for forming each of the pattern of the gate electrode and the gate line, the pattern of the active layer, the pattern of the source electrode, the drain electrode and the data line, the pattern of the pixel electrode, and the pattern of a through hole. Thus, the ADS mode TFT-LCD array substrate as illustrated in FIG. 1 can be formed by the mask patterning process for 1+5 times.

In particular, the pattern of the active layer and the pattern of the pixel electrode are respectively formed by one mask patterning process. In addition, each mask patterning process includes a plurality of steps. Therefore, the manufacturing process of the conventional array substrate is complicated and the productivity is difficult to improve.

SUMMARY

One aspect of the disclosure provides an array substrate comprising a plurality of pixel units, and each pixel unit comprises a thin film transistor (TFT), a transparent conductive layer and a pixel electrode; the TFT includes a gate electrode, an active layer, a source electrode and a drain electrode; the active layer is disposed above or below the gate electrodes; the transparent conductive layer contacts with the active layer; and a channel of the active layer is defined by the source electrode and the drain electrode.

Another aspect of the disclosure provides a display device, which comprises the aforesaid array substrate.

Still another aspect of the disclosure provides a method for manufacturing the array substrate, which comprises: depositing a transparent conductive film and an active layer film on a substrate; and forming patterns of a pixel electrode, a transparent conductive layer and an active layer by one half-tone or gray-tone mask patterning process, and the transparent conductive layer contacts with the active layer.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein:

FIG. 2b is a cross-section view along line A-A in FIG. 2a;

DETAILED DESCRIPTION

For more clear understanding of the objectives, technical proposals and advantages of the embodiments of the disclosure, clear and complete description will be given below to the technical proposals of the embodiments of the disclosure with reference to the accompanying drawings of the embodiments of the disclosure. It will be obvious to those skilled in the art that the preferred embodiments are only partial embodiments of the disclosure but not all the embodiments.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With respect to the technical problems of complicated manufacturing process and difficultly improved productivity of the conventional array substrate, embodiments of the disclosure provide an array substrate, a display panel and a method for manufacturing the array substrate.

Figure 4:
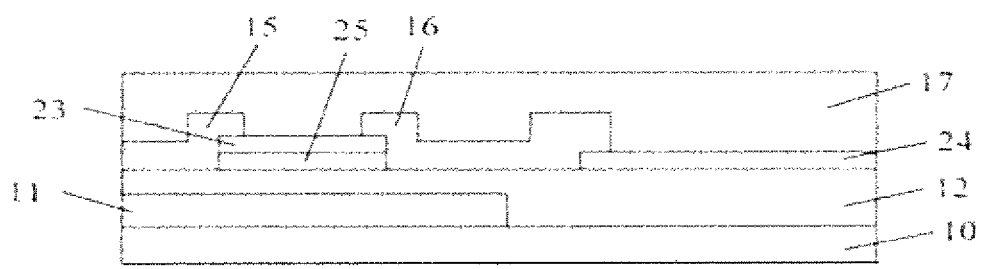
FIG. 4 is a schematic structural view of the array substrate in the embodiment of the disclosure (TN mode for example).

As illustrated in FIG. 4, in one embodiment of the disclosure, the array substrate comprises a plurality of pixel units (the figure is the cross-section view of a pixel unit at a TFT of the pixel unit for example). Each pixel unit comprises a TFT, a transparent conductive layer 25, and a pixel electrode 24; the transparent conductive layer 25 is, for instance, a transparent conductive metal layer or a transparent conductive oxide layer.

The TFT includes a gate electrode 11, a gate insulating layer 12, an active layer 23, a source electrode 15 and a drain electrode 16; the active layer 23 is disposed above or below the gate electrode 11 and isolated from the gate electrode 11 through the gate insulating layer.

The transparent conductive layer 25 makes contact with the active layer 23 in a laminated way but does not make contact with the source electrode 15 and the drain electrode 16, that is, the transparent conductive layer 25 and the active layer 23 are in two adjacent layers contacting each other; a channel of the active layer 23 is defined by the source electrode 15 and the drain electrode 16, and this part of the active layer 23, between the source electrode 15 and the drain electrode 16, works as the channel for carriers during the operation of the TFT. Here, the drain electrode 16 is connected with the pixel electrode 24. It should be noted that the source electrode and the drain electrode in the TFT are exchangeable as desired.

The array substrate of the embodiment of the disclosure can adopt various types or modes, for example, can be a bottom-gate array substrate (in which the active layer in the TFTs are disposed above the gate electrodes) or a top-gate array substrate (in which the active layer in the TFTs are disposed below the gate electrodes). The structure and position of the various film layers of the array substrate may be varied as long as components (such as the gate electrodes, the active layer, the source electrodes, the drain electrodes and the pixel electrode) required by a pixel drive circuit of the display device can be manufactured and the normal drive of the display device can be ensured. The transparent conductive layer and the pixel electrode can be made of the same material so that the pixel electrode and the transparent conductive layer can be formed on the same layer.

Taking the bottom-gate array substrate for example, as illustrated in FIG. 4, the example may comprise a transparent substrate 10, a gate line (not shown in the figure) electrically connected with gate electrodes 11, a gate insulating layer 12, and a data line (not shown in the figure) electrically connected with a source electrode 15. In addition, the transparent substrate 10, for instance, may be a glass substrate, a plastic substrate, a quartz substrate or the like.

The gate electrode 11 and the gate line are formed on the transparent substrate 10 and may be formed integrally; the gate insulating layer 12 are formed on the gate electrode 11 and the gate line and cover the substrate 10; the pixel electrode 24 and the transparent conductive layer 25 are formed on the gate insulating layer 12, and the transparent conductive layer 23 is disposed above the gate electrode 11; the active layer 23 is formed on and make contact with the transparent conductive layer 25, and further is opposed to the gate electrode 11; and the source electrode 15 and the drain electrode 16 are formed on the active layer 23.

In the array substrate of the embodiment, due to the transparent conductive layer 25 disposed under the active layer 23, the pixel electrode 24 and the active layer 23 can be formed by one half-tone or gray-tone mask patterning process. Moreover, the transparent conductive layer 25 does not affect the functions or operations of the array substrate. Compared with the conventional array substrate, one mask patterning process can be saved during the manufacturing of the array substrate of the embodiment, so that the manufacturing process become simplified, and meanwhile, possible product defects brought by the saved mask patterning process can be reduced and the productivity can be greatly improved.

In the embodiment as illustrated in FIG. 4, the array substrate may further comprise a passivation layer 17; the passivation layer 17 is disposed on the structure composed of the TFT, the transparent conductive layer 25 and the pixel electrode 24, and is provided with a through hole (not shown in the figure) in a signal pad region of the substrate. The array substrate with the above structure can be applied to a TN mode display device. In the TN mode display device, a common electrode is arranged on a counter substrate (such as a color filter substrate), and the counter substrate and the array substrate are opposed to each other and combined with each other through a sealant to form a liquid crystal cell.

Figure 1:
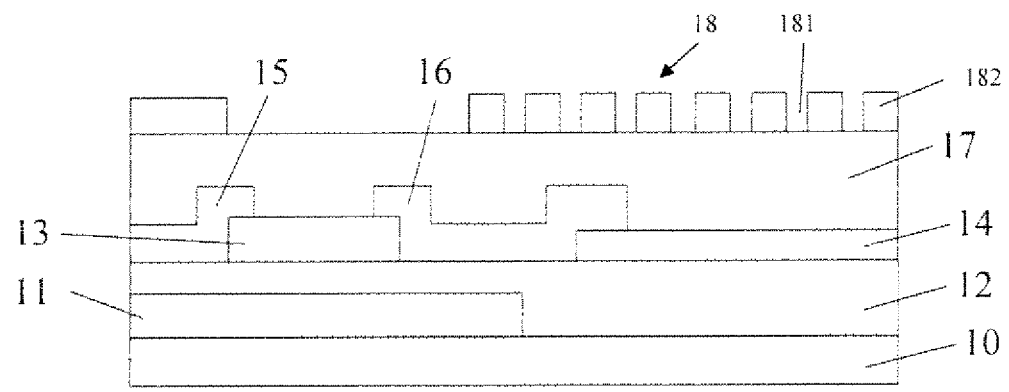
FIG. 1 is a schematic sectional view of the conventional array substrate structure (ADS mode)
Figure 2A:
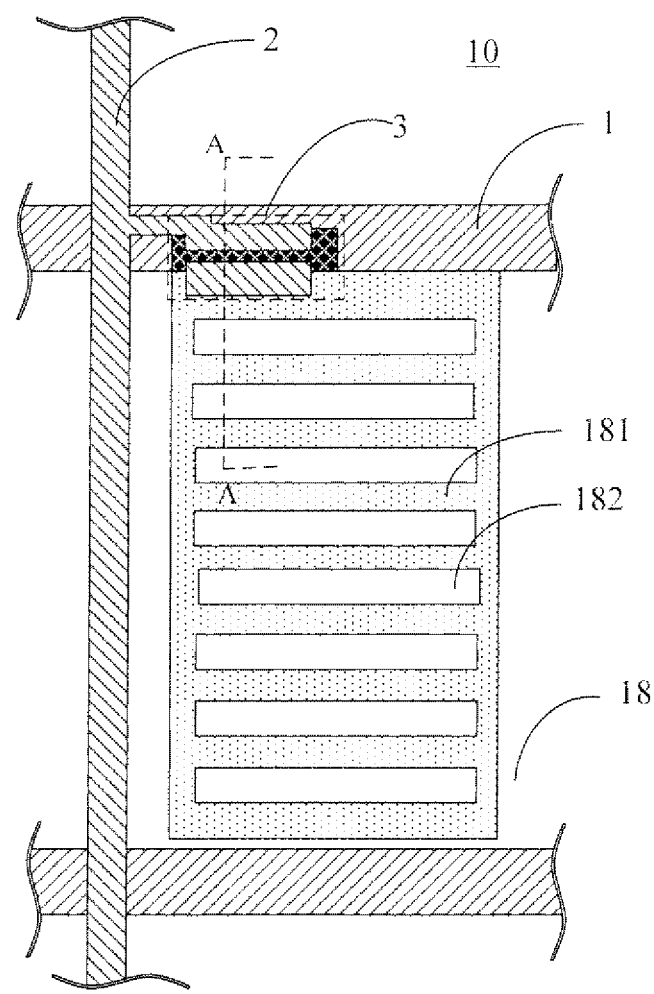
FIG. 2a is a schematic structural view of an array substrate in an embodiment of the disclosure (ADS mode for example)
Figure 2B:
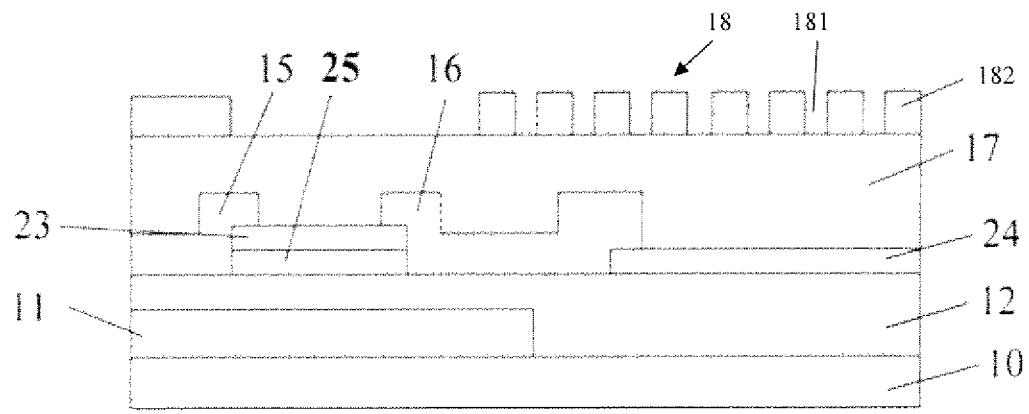

As illustrated in FIG. 2a and FIG. 2b, when the array substrate of the embodiment is an ADS mode array substrate, the array substrate comprises a gate line 1 and a data line 2, which intersect each other to define a pixel unit; the pixel unit comprises a thin film transistor (TFT) 3, and a part of the gate line 1 works as the gate electrode of the TFT 3. The array substrate may further comprise a passivation layer 17 and a common electrode 18; the passivation layer 17 is formed on the source electrode 15, the drain electrode 16 and the data line, and covers the substrate 10. In addition, in signal pad region of the array substrate, the passivation layer 17 may also be provided with through a hole (not shown in the figure) for the exposure of a gate line terminal and a data line terminal. Moreover, the common electrode 18 is formed on the passivation layer 17 and has slit structures, namely the common electrode 18 is provided with slits 181 and electrode strips 182. Here, the pixel electrode 24 may be a plate electrode (without openings) or a slit electrode (with openings as slits).

In another embodiment of the disclosure, the array substrate comprises a pixel electrode with slit structure and further comprises a common electrode which is disposed below and isolated from the pixel electrode. When the array substrate adopts the ADS mode, between the pixel electrode and the common electrode of each pixel unit, for instance, the electrode on the upper level can have a slit structure and the electrode on the lower level may have a plate structure. The common electrode may be disposed above the gate insulating layer or formed with the gate electrode in one patterning process. Moreover, the common electrodes may be formed of a transparent conductive layer.

An embodiment of the disclosure also provides a display device, which comprises any one of the foregoing array substrates. The display device can be applied to any product or component with display function, such as an LCD panel, an electronic paper device (EP), an organic light emitting display (OLED) panel, a mobile phone, a tablet PC, a television, a display terminal, a notebook, a digital photo frame and a navigator.

One example of the display device is an LCD device, in which an array substrate and a counter substrate are arranged opposed to each other to form a liquid crystal cell which is filled with liquid crystal material; the counter substrate, for instance, is a color filter substrate; and the pixel electrode of each pixel unit of the array substrate is used for applying an electric field to control the rotation degree of the liquid crystal material and hence achieve the display objective.

Another example of the display device is an OLED, in which laminated layers of organic light emitting materials are formed on an array substrate, and the pixel electrode of each pixel unit is taken as an anode or a cathode to drive the organic light emitting materials for luminescence and hence achieve the display objective.

An embodiment of the disclosure provides a method for manufacturing the array substrate, which comprises the following steps of: depositing a transparent conductive film and an active layer film on a substrate; and forming a pattern of pixel electrode, a transparent conductive layer and an active layer by one half-tone or gray-tone mask patterning process; the transparent conductive layer make contact with the active layer.

The formation of the pattern of the pixel electrode, the transparent conductive layer and the active layer by one half-tone or gray-tone mask patterning process can be conducted in the following manners.

In one example, a photoresist layer coated on the substrate is exposed with a mask plate having a full-transparent area, a semi-transparent area and a light-tight area; the photoresist at the corresponding position of the full-transparent area is fully exposed; the photoresist at the corresponding position of the semi-transparent area is partially exposed; and the photoresist at the corresponding position of the light-tight areas is not exposed. When the photoresist layer after the exposing process is developed, in the case where positive photoresist is adopted, the fully exposed photoresist is completely removed, the partially exposed photoresist is partially removed (with the reduced thickness), and the photoresist which is not exposed is retained (with the thickness basically not changed). Further, in the case where negative photoresist is adopted, the fully exposed photoresist is retained (with the thickness basically not changed), the partially exposed photoresist is partially removed (with the reduced thickness), and the photoresist which is not exposed is completely removed.

In a photoresist-completely-removed region, the gate insulating layer is exposed after the etching process. In a photoresist-partially-removed region, the pattern of the pixel electrode is formed after the etching process. In a photoresist-completely-retained region, the pattern of the transparent conductive layer and the pattern of the active layer is formed after the etching process.

The semi-transparent effect of the semi-transparent area of each mask plate can be achieved with two or more slits; namely the partially transparent effect may be achieved by double-slit interference. Moreover, the semi-transparent effect may also be achieved by a semi-transparent film which allows part of light to travel through. The light transmittance of the semi-transparent film may be between about 35 and 45 percent, and the semi-transparent film may be made of a material such as oxides and nitrides of chromium, monium and manganese, organic glass, transparent thermoset high molecular materials or methylpentene polymers.

Before the step of forming the patterns of the pixel electrode, the transparent conductive layer and the active layer, the method of the embodiment may further comprise the step of forming a pattern of gate electrode and a gate line and the gate insulating layer on the transparent substrate.

After the step of forming the pattern of the pixel electrode, the transparent conductive layer and the active layer, the embodiment may further comprise, for instance, the following steps of: forming a pattern of a source electrode and a drain electrode, which are formed opposed to each other and used for defining a channel therebetween, on the active layer, and meanwhile, forming a pattern of a data line, which is electrically connected with the source electrode, on the substrate; and forming a passivation layer, which covers the substrate, on the source electrode, the drain electrode and the data line, and forming a pattern of a through hole in a signal pad region of the substrate, so as to expose a gate line terminal and a data line terminal. Moreover, the part of the active layer, between the source electrode and the drain electrode, works as the channel of carriers during the operation.

In the embodiment of manufacturing the ADS mode array substrate, after the step of forming the passivation layer and the pattern of the through hole, the method further comprises the step of forming a pattern of a common electrode with a slit structure on the passivation layer, in which the common electrode is a slit electrode and isolated from but overlaps with the pixel electrode through an insulating layer.

The ADS mode TFT-LCD array substrate as illustrated in FIG. 2a can be formed by the mask patterning process for 1+4 times in total. In one example, the manufacturing method comprises the following steps.

Step 201: depositing a gate metal film on a transparent substrate, and forming a pattern of a gate electrode and a gate line by a first mask patterning process.

The gate metal film may be a single-layer film made of aluminum, chromium, tungsten, tantalum, titanium, molybdenum or molybdenum-nickel and may also be a multilayer composite film formed by any of the single-layer films. The deposition method of the metal film, for instance, may be physical vapor deposition (PVD) or the like.

Step 202: depositing a gate insulating layer, a first transparent conductive film and an active layer film on the substrate after the step 201, and forming patterns of a pixel electrode, a transparent conductive layer and an active layer by one half-tone mask patterning process (i.e., a second mask patterning process).

The gate insulating layer may be made of silicon nitride or the like and, for example, may be formed by a chemical vapor deposition (CVD) method; the first transparent conductive film may be made of indium tin oxide (ITO), indium zinc oxide (IZO) or the like and may be formed by a PVD method; and the active layer film may be made of amorphous silicon, hydrogenated amorphous silicon or the like and, for example, may be formed by a CVD method.

Step 203: depositing a metal film for a source electrode and a drain electrode on the substrate after the step 202, and forming a pattern of the source electrode, the drain electrode and a data line by a third mask patterning process.

The metal film for the source electrode and the drain electrode may be a single-layer film made of aluminum, chromium, tungsten, tantalum, titanium, molybdenum or molybdenum-nickel and may also be a multilayer composite film formed by any of the single-layer films. The deposition method of the metal film, for instance, may be PVD.

Step 204: depositing passivation layer on the substrate after the step 203, and forming a pattern of a through hole in a signal pad region by a fourth mask patterning process. Due to the through hole in the signal pad region, a gate line terminal and a data line terminal are exposed. In addition, the passivation layer, for example, may be made of silicon nitride or the like.

Step 205: depositing a second transparent conductive film on the substrate after the step 204, and forming a pattern of a common electrode with a slit structure by the a fifth mask patterning process.

The second transparent conductive film may be made of the same material with the first transparent conductive film, such as ITO or IZO, and may be formed by a PVD method.

An example of the step 202 may be as follows with reference to FIGS. 3a to 3e.

Figure 3A:
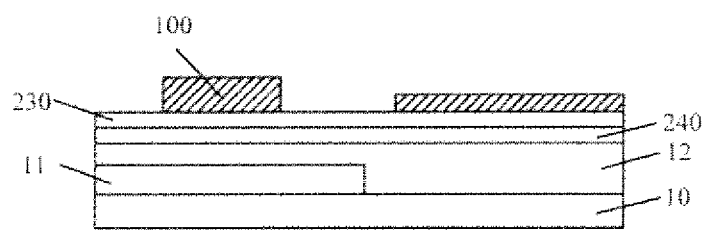
FIGS. 3a to 3e are schematic diagrams of a half-tone mask process for forming the array substrate.
Figure 3B:
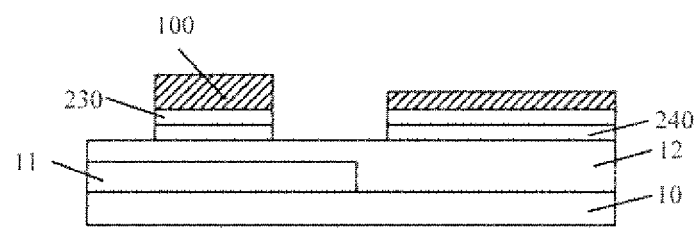
Figure 3C:
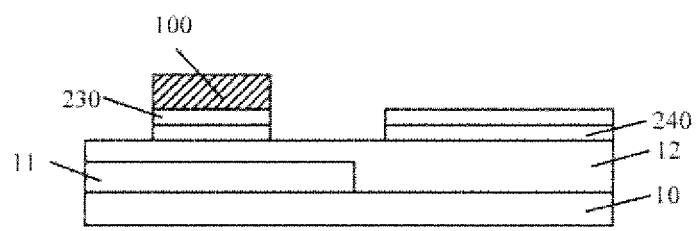
Figure 3D:
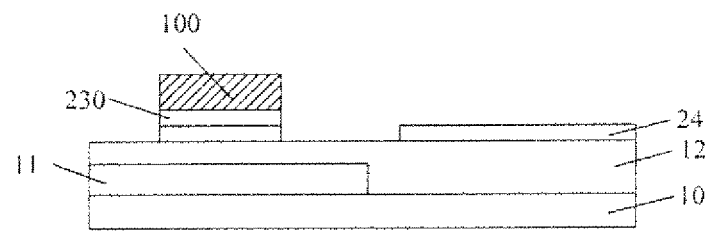
Figure 3E:
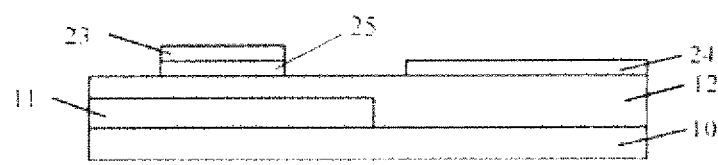

Step 2021: depositing a gate insulating layer 12 by a CVD method, a first transparent conductive film (i.e., transparent conductive film 240) by a PVD method, and an active layer film 230 by a CVD method, on the substrate after the step 201;

Step 2022: coating a layer of positive photoresist 100 on the substrate after the step 2021;

Step 2023: exposing the photoresist coated on the substrate with a mask plate having a full-transparent area, a semi-transparent area and a light-tight area, in which the photoresist corresponding to the full-transparent area of the mask plate is fully exposed, the photoresist corresponding to the semi-transparent area of the mask plate is partially exposed, and the photoresist corresponding to the light-tight area of the mask plate is not exposed;

Step 2024: developing the photoresist coated on the substrate after the step 2023, completely dissolving and removing the photoresist in the fully exposed area, partially dissolving and removing the photoresist in the partially exposed area so that the thickness is reduced, and retaining the photoresist 100 in the non-exposed area so that the thickness is basically not changed, thereby forming etching stop mask for the subsequent etch process, as illustrated in FIG. 3a;

Step 2025: etching the substrate after the step 2024, in which the gate insulating layer 12 is exposed after the fully exposed area is subjected to etching, as illustrated in FIG. 3b;

Step 2026: removing the residual partial photoresist in the partially exposed area from the substrate after the step 2025 by an ashing process, so that the active layer film 230 in the area is exposed, partially retaining the photoresist in the non-exposed area (with the reduced thickness), continuously etching the active layer film in the partially exposed area so as to remove the active layer film until the pixel electrode 24 is exposed as illustrated in FIGS. 3c and 3d; and Step 2027: removing the residual photoresist on the substrate after the step 2026 until the active layer 23 is exposed as illustrated in FIG. 3e.

The pattern of the pixel electrode formed in the step 202 may have a slit structure. Moreover, in this case, before the step S202, the method may further comprise the step of forming the pattern of the common electrode which is disposed below and isolated from the pixel electrode that is to be formed with the slit structure. Moreover, the common electrode and the pixel electrode overlap with each other.

When the array substrate to be manufactured is in the ADS mode, during the manufacturing, between a common electrode and a pixel electrode on the same pixel region, the electrode on the upper level may have a slit structure while the electrode on the lower level may have a plate structure. Moreover, the common electrode may be disposed above the gate insulating layer or formed with the gate electrode by one patterning process.

The method for manufacturing the array substrate in the embodiment of the disclosure is also applicable to the TN mode (the TN mode array substrate can be produced via the steps 201 to 204), the IPS mode or other display modes.

As for the TN mode array substrate as illustrated in FIG. 4, the pattern of the pixel electrode and the pattern of the active layer can be formed by same one half-tone mask patterning process.

In the embodiments of the disclosure, as the transparent conductive layer make contact with the active layer, during the manufacturing of the array substrate, the pattern of the pixel electrode and the pattern of the active layer can be formed by same one half-tone mask patterning process after the deposition of the transparent conductive film and the active layer film. Therefore, compared with the conventional technology, one mask patterning process can be saved, so that the manufacturing process is greatly simplified, and meanwhile, possible product defects brought by the saved mask patterning process can be reduced and the productivity can be greatly improved.

The embodiment of the disclosure being thus described, it will be obvious that the same may be varied in many ways. Such variations are not to be regarded as a departure from the spirit and scope of the disclosure, and all such modifications as would be obvious to those skilled in the art are intended to be included within the scope of the following claims.

What is claimed is:

1. An array substrate, comprising a plurality of pixel units, each pixel unit comprising a thin film transistor (TFT), a transparent conductive layer and a pixel electrode, the TFT including a gate electrode, an active layer, a source electrode and a drain electrode, wherein the active layer is disposed above or below the gate electrodes;

the transparent conductive layer contacts with the active layer;

a channel of the active layer is defined by the source electrode and the drain electrode; and the transparent conductive layer and the active layer are stacked together and have substantially the same size in a direction parallel to a direction connecting the source electrode and the drain electrode; the transparent conductive layer and the pixel electrode are disposed in same one horizontal layer.

2. The array substrate according to claim 1, wherein the transparent conductive layer and the pixel electrode are made of a same material.

3. The array substrate according to claim 1, further comprising a passivation layer, and each passivation layer is disposed on a structure composed of the TFT, the transparent conductive layer and the pixel electrode, and covers a substrate.

4. The array substrate according to claim 3, further comprising a common electrode which is formed on the passivation layer and has a slit structure.

5. The array substrate according to claim 2, further comprising a passivation layer, and each passivation layer is disposed on a structure composed of the TFT, the transparent conductive layer and the pixel electrode, covers a substrate, and comprises a through hole in a signal pad region of the substrate.

6. The array substrate according to claim 5, further comprising a common electrode which is formed on the passivation layer and has a slit structure.

7. The array substrate according to claim 1, further comprising a substrate, a gate line electrically connected with the gate electrode, a gate insulating layer, and a data line electrically connected with the source electrode, wherein the drain electrode is electrically connected with the pixel electrode;

the gate electrode and the gate line are formed on the substrate;

the gate insulating layer is formed on the gate electrode and the gate line and covers the substrate;

the pixel electrode and the transparent conductive layer are formed on the gate insulating layer, and the transparent conductive layer is disposed above the gate electrode;

the active layer is formed on and contacts with the transparent conductive layer; and the source electrode and the drain electrode are formed on the active layer.

8. A display device, comprising the array substrate according to claim 1.

9. A method for manufacturing the array substrate, comprising:

depositing a transparent conductive film and an active layer film on a substrate; and forming patterns of a pixel electrode, a transparent conductive layer and an active layer by one half-tone or gray-tone mask patterning process, wherein the transparent conductive layer makes contact with the active layer, and the transparent conductive layer and the active layer are stacked together and have substantially the same size in a direction parallel to a direction connecting the source electrode and the drain electrode; the transparent conductive layer and the pixel electrode are disposed in same one horizontal layer.

10. The manufacturing method according to claim 9, wherein forming of the pattern of the pixel electrode, the transparent conductive layer and the active layer by one half-tone or gray-tone mask patterning process further comprises:

exposing a photoresist layer coated on the substrate with a mask plate having a full-transparent area, a semi-transparent area and a light-tight area so as to form an etching mask of photoresist with different thicknesses in different areas.

11. The manufacturing method according to claim 9, wherein the substrates are transparent substrates, before forming of the patterns of the pixel electrode, the transparent conductive layer and the active layer, the manufacturing method further comprises:

forming a pattern of a gate electrode and a gate line and forming a gate insulating layer on the transparent substrates.

12. The manufacturing method according to claim 10, wherein the substrates are transparent substrates, before forming of the patterns of the pixel electrode, the transparent conductive layer and the active layer, the manufacturing method further comprises:

forming a pattern of a gate electrode and a gate line and forming a gate insulating layer on the transparent substrates.

13. The manufacturing method according to claim 9, wherein after forming of the patterns of the pixel electrode, the transparent conductive layer and the active layer, the manufacturing method further comprises:

forming a pattern of a source electrode and a drain electrode, which are formed opposed to each other and used for defining a channel therebetween, on the active layer, and meanwhile, forming a pattern of a data line, which is electrically connected with the source electrode, on the substrate; and forming a passivation layer, which covers the substrate, on the source electrode, the drain electrode and the data line, and forming a pattern of a through hole in a signal pad region of the substrate.

14. The manufacturing method according to claim 13, wherein after forming of the passivation layer, which covers the substrates, on the source electrode, the drain electrode and the data line, and forming of the pattern of the through hole in the signal pad region of the substrate, the manufacturing method further comprises: forming a pattern of a common electrode having a slit structure on the passivation layer.

* * * * *